(12) United States Patent
Chu et al.

(10) Patent No.: US 11,573,207 B2
(45) Date of Patent: Feb. 7, 2023

(54) OBJECT PERSPECTIVE DETECTOR

(71) Applicants: Tzu-How Chu, Taipei (TW); Pi-Pai Chang, Taipei (TW)

(72) Inventors: Tzu-How Chu, Taipei (TW); Pi-Pai Chang, Taipei (TW)

( * ) Notice: Subject to any disclaimer, the term of this patent is extended or adjusted under 35 U.S.C. 154(b) by 975 days.

(21) Appl. No.: 16/377,265

(22) Filed: Apr. 8, 2019

(65) Prior Publication Data
US 2020/0319143 A1    Oct. 8, 2020

(51) Int. Cl.
*G01N 29/00* (2006.01)
*G01N 29/22* (2006.01)
*G01N 27/00* (2006.01)
*G01R 29/08* (2006.01)
*H02J 7/00* (2006.01)

(52) U.S. Cl.
CPC .......... *G01N 29/22* (2013.01); *G01N 27/00* (2013.01); *G01R 29/0878* (2013.01); *H02J 7/00* (2013.01); *G01N 2291/02863* (2013.01)

(58) Field of Classification Search
CPC ........ G01N 2291/02863; G01N 27/00; G01N 29/22; G01R 29/0878; G01V 3/12; H02J 7/00; E21B 47/12; E21B 47/00
See application file for complete search history.

(56) References Cited

U.S. PATENT DOCUMENTS

| | | | | |
|---|---|---|---|---|
| 5,941,307 A | * | 8/1999 | Tubel | E21B 41/0035 166/50 |
| 8,461,720 B2 | * | 6/2013 | Kurs | H01Q 1/248 307/104 |
| 8,598,864 B2 | * | 12/2013 | Kalokitis | G01R 31/085 324/555 |
| 9,404,954 B2 | * | 8/2016 | Roy | H02J 50/50 |
| 2011/0095763 A1 | * | 4/2011 | Linscott | G01V 3/12 324/72 |

* cited by examiner

*Primary Examiner* — Vinh P Nguyen

(57) ABSTRACT

An object perspective detector including an electric field sensing module, a signal processing module, a battery module, an analog digital conversion module, a human-machine interface analysis module and a radio transmission module. The electric field sensing module is electrically connected to the signal processing module to form a loop. The electric field sensing module which receives electric field intensity changes to generate electric signals, can be an antenna of capacitor medium, convenient for changing the detection space.

4 Claims, 3 Drawing Sheets

OBJECT PERSPECTIVE DETECTOR

BACKGROUND OF INVENTION

1. Field of the Invention

The present invention relates generally to an object perspective monitor, and more particularly to a device which can be aligned with the user's object to be detected, using ultra low frequency electromagnetic waves to penetrate through the object, and the reflected ultra low frequency radio signals transmit relevant information to the user, the shape, morphology, temperature, substance, water content, hardness and thickness inside the object are estimated by reflecting the electrical properties of various layers in the object.

Therefore, the present invention can effectively see through the substance characteristics inside the strata and buildings, the groundwater horizon distribution and depth, and the physical characteristics of underground substances, so as to implement convenient detection and analysis.

2. Description of Related Art

The general electromagnetic wave and ultrasonic sensors for the existing instruments for detecting underground conditions or the interior of buildings have insufficient perspectivity and misrecognitions. Therefore, the building and underground conditions cannot be detected, hazarding common people's safety and causing heavy economic losses.

In addition, people have an urgent need for the ability to see through objects and the earth's surface, so as to explore the rich underground resources. However, the existing products have no low price, convenience and quick ness of this new instrument.

At present, the invented underground perspective systems which are able to use electric energy and control circuits are expensive, large sized and heavy, their insufficient elasticity and slow detection reduce the user's convenience.

Some of the known perspective systems use image processing for detecting underground substances, but they have poor control and slow response, some products generate electromagnetic waves, hazarding the user's safety and health. In addition, a large additional battery or power supply is required, which is likely to be disturbed by radio waves from the external environment, reducing the user's safety, convenience and accuracy.

In view of this, how to provide an object perspective monitor which can solve and improve the problems in the aforesaid object perspective and monitoring systems becomes the topic to be improved by the present invention.

SUMMARY OF THE INVENTION

The purpose of the present invention is to provide an object perspective monitor, which is installed in the space set by the user, the electric field sensing is the core, it can receive the ultra low frequency electromagnetic waves reflected from the inside of object to reflect the linear feature inside the object. Therefore, the present invention can detect the groundwater horizon distribution, depth and thickness effectively, as well as the physical characteristics of underground substances, such as water content and substance category, the maximum detection depth is 6000 m, and it can transmit ultra-low frequency radio waves in time to reflect the detected information, its advantages include timely mining, compactness, light weight, low cost, high safety, high elasticity, durability, energy saving and convenient operation.

In order to solve the above technical problems, the present invention adopts the following technical solutions:

An object perspective monitor, comprising: an electric field sensing module, a signal processing module, a battery module, an analog digital conversion module, a human-machine interface analysis module and a radio transmission module:

wherein the electric field sensing module is electrically connected to the signal processing module to form a loop;

the electric field sensing module which receives electric field intensity changes to generate electric signals, is an antenna of capacitor medium, convenient for changing the detection space.

More particularly, wherein the signal processing module includes an amplifier circuit and a filter; the amplifier circuit is electrically connected to the electric field sensing module and the battery module respectively to form a loop; the filter is electrically connected to the amplifier circuit, and electrically connected to the battery module, the analog digital conversion module and the radio transmission module respectively to form a loop.

More particularly, wherein the battery module has a battery pack, at least one USB charger and a power switch unit; the battery pack is electrically connected to the USB charger and the power switch unit respectively to form a loop; the power switch unit is electrically connected to the electric field sensing module and the signal processing module respectively to form a loop;

the object perspective monitor has an outer casing, the battery module is located in the outer casing, and the USB charger is located on one side of the outer casing.

More particularly, wherein the human-machine interface analysis module includes an audio and video interactive device, a material status display and a substance depth display;

wherein the human-machine interface analysis module is optionally connected to at least one of the audio and video interactive device, the material status display and the substance depth display, and the substance depth display are activated automatically when a person is approaching; the radio transmission module is applicable to long range telemetering or other controls.

In comparison to the existing technology, the effects of the present invention are described below:

1. In the present invention, the electric field sensing module cooperates with a signal processing module, when the electric field intensity varies with physical makeup, the signal processing module generates the corresponding electric signal, which is imported into the analog digital conversion module immediately, and into the human-machine interface analysis module, quick response and high safety, above all, faults are unlikely to occur, the impact resistance is good. The ultra low frequency electromagnetic waves have strong penetrating power, deep stratigraphic information can be explored.

2. In the present invention, a battery module is located in the outer easing, which can be charged by USB charger, in comparison to the known object perspective and monitoring systems, it has high safety, no need for additional batteries, flexible application and good convenience.

SUMMARY OF THE INVENTION

DETAILED DESCRIPTION OF THE INVENTION

Figure 1:
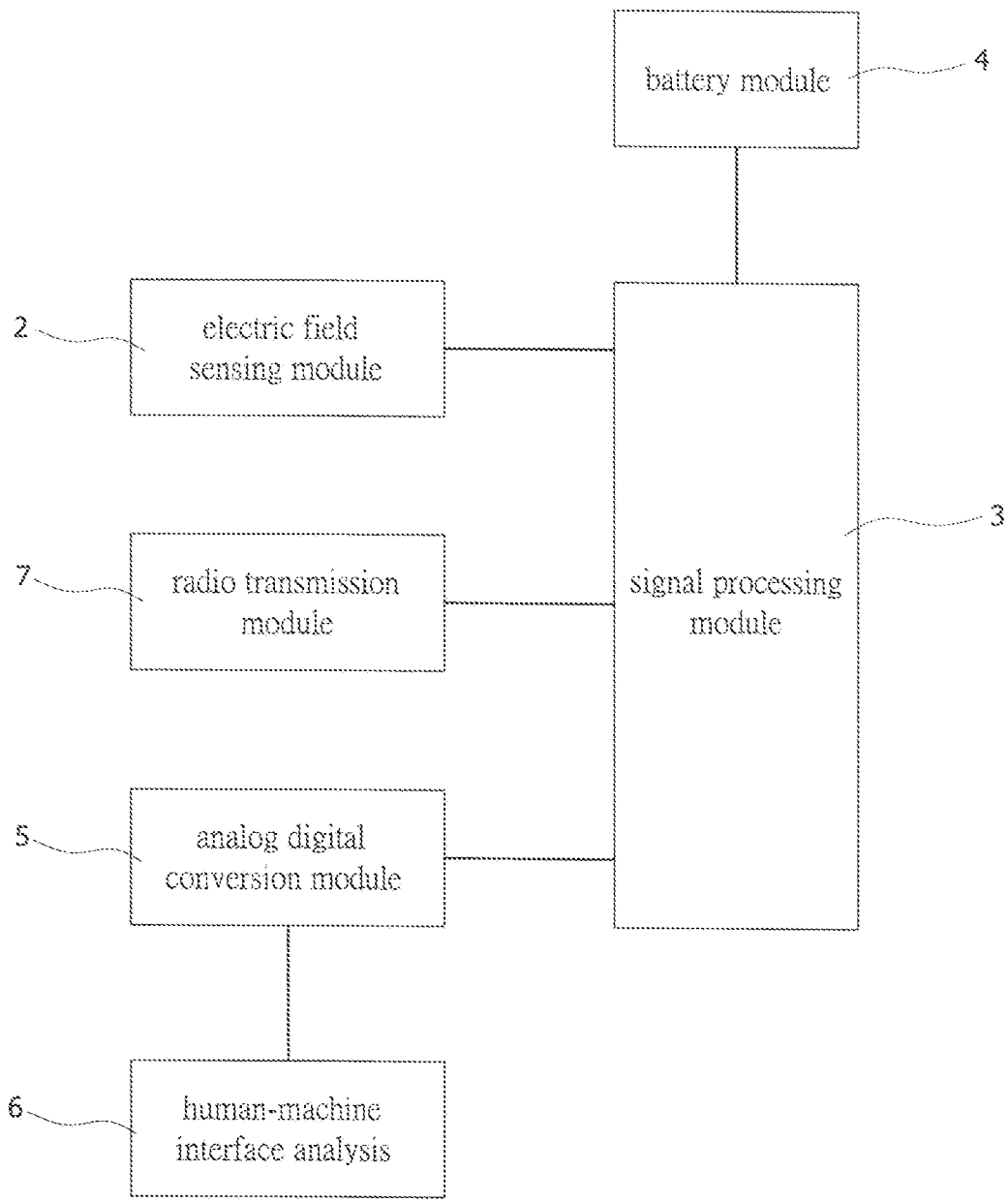
FIG. 1 is a system architecture diagram of the present invention.

The detailed description is given below according to the figures:

FIG. 1 discloses an object perspective monitor, which comprises an electric field sensing module (2), a signal processing module (3), a battery module (4), an analog digital conversion module (5), a human-machine interface analysis module (6) and a radio transmission module (7). The aforementioned electric field sensing module (2) is electrically connected to the signal processing module (3) to form a loop. The aforementioned electric field sensing module (2) which receives the electric field intensity changes to generate electric signals, can be an antenna of capacitor medium, convenient for changing the detection space.

The electric field sensing module (2) cooperates with the signal processing module (3), when the electric field intensity varies with substance, the signal processing module (3) generates electric signal, which is imported into the analog digital conversion module (5) immediately; and into the human-machine interface analysis module (6), quick response and high safety.

Figure 2:
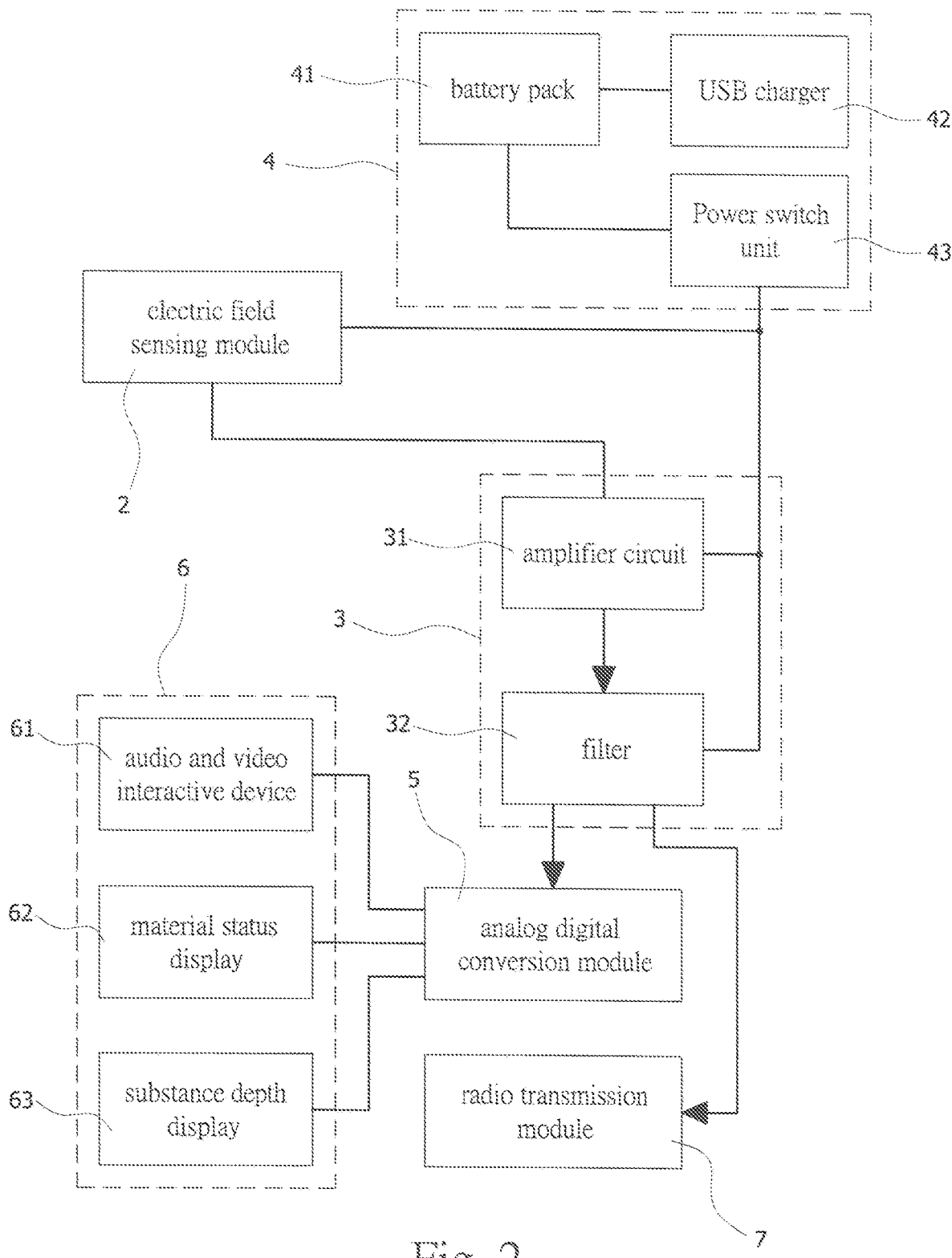
FIG. 2 is a detailed block diagram of the system of the present invention.

As shown in FIG. 2, the aforementioned signal processing module (3) comprises an amplifier circuit (31) and a filter (32), the amplifier circuit (31) is electrically connected to the electric field sensing module (2) and the battery module (4) respectively to form a loop. The filter (32) is electrically connected to the amplifier circuit (31), and electrically connected to the battery module (4), the analog digital conversion module (5) and the radio transmission module (7) respectively to form a loop.

Wherein the electric field sensing module (2) has simple components, reducing the cost, convenient for production, and the failure rate can be minimized.

Figure 3:
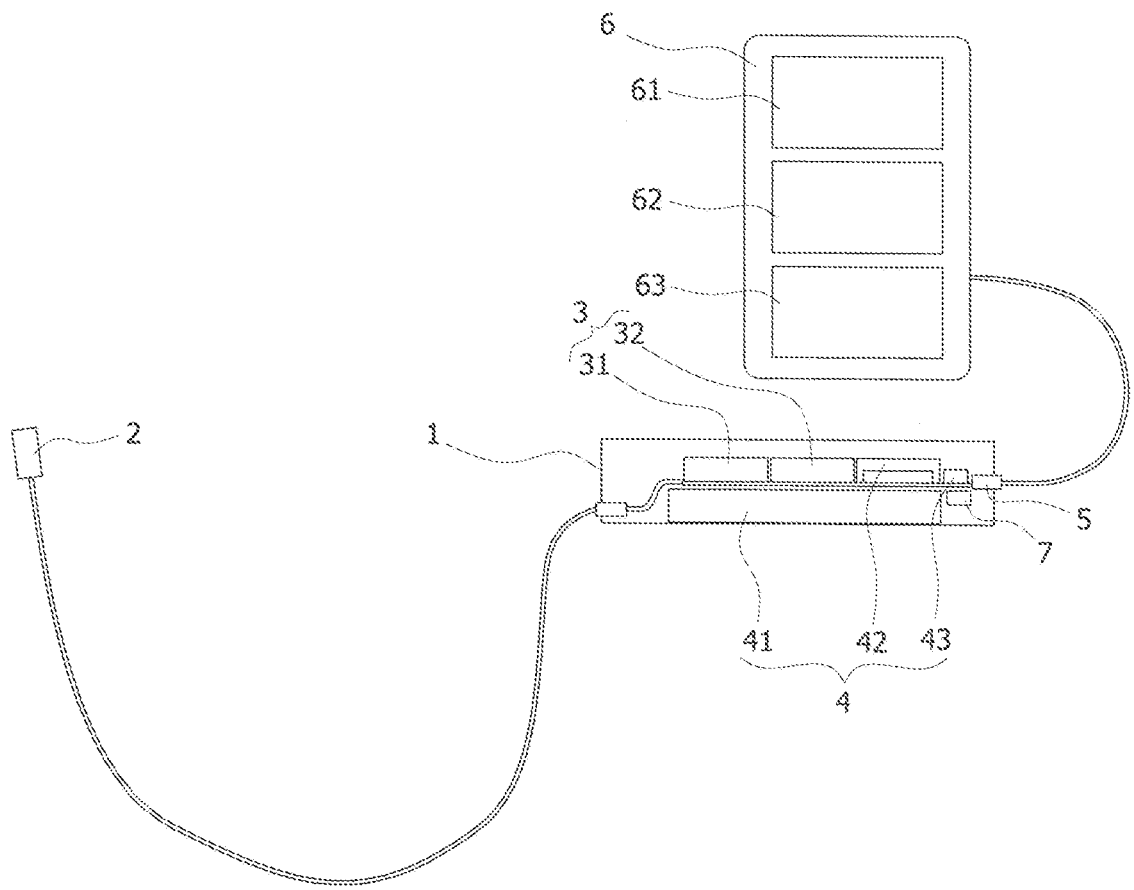
FIG. 3 is a front elevational view of the principle of the present invention.

As shown in FIG. 2 and FIG. 3, the aforementioned battery module (4) comprises a battery pack (41), at least one USB charger (42) and a power switch unit (43). The battery pack (41) is electrically connected to the USB charger (42) and the power switch unit (43) respectively to form a loop. The power switch unit (43) is electrically connected to the electric field sensing module (2) and the signal processing module (3) respectively to form a loop. The aforementioned object perspective monitor has an outer casing (i), the battery module (4) is located in the outer casing (1), and the USB charger (42) is located on one side of the outer casing (1).

FIG. 3 discloses an object perspective monitor, which comprises the modules composing the object perspective monitor of the aforesaid executive plan, features: the aforementioned human-machine interface analysis module (6) has an audio and video interactive device (61), a material status display (62) and a substance depth display (63). The aforementioned human-machine interface analysis module (6) can be optionally connected to at least one of the audio and video interactive device (61), the material status display (62) and the substance depth display (63), and the substance depth display (63) can be started up automatically when a person is approaching. The aforementioned radio transmission module (7) is applicable to long range telemetering or other controls.

As the electric field intensity varies with substance, the electric field sensing module (2) exports the corresponding electric signal, the electric signal is amplified by the signal processing module (3) and the noise is removed, and then it is sent to the analog digital conversion module (5) and the human-machine interface analysis module (6), so as to detect the target. In comparison to the known object perspective and monitoring systems, the response is taster, there is no electromagnetic wave signal interference, the user's safety is high, no need for external batteries or power supply, the service flexibility is sufficient, implementing safety, energy saving, health and convenience.

The preferred embodiment of the present invention is given above, any modificatory changes matching the present invention shall be within the claims of the present invention.

The above only describes some exemplary embodiments of the present invention. Those having ordinary skills in the art may also make many modifications and improvements without departing from the conception of the invention, which shall all fall within the protection scope of the invention.

We claim:

1. An object perspective detector, comprising:
an electric field sensing module (2), a signal processing module (3), a battery module (4), wherein the electric field sensing module (2) and the signal processing module (3) is electrically connected to the battery module (4), an analog digital conversion module (5) electrically connected to the signal processing module (3), a human-machine interface analysis module (6) electrically connected to the analog digital conversion module (5) and a radio transmission module (7) electrically connected to the electric field sensing module (2);
wherein the electric field sensing module (2) is electrically connected to the signal processing module (3) to form a loop;
the electric field sensing module (2) which receives electric field intensity changes to generate electric signals, is an antenna of capacitor medium, convenient for changing a detection space.

2. The object perspective detector defined in claim 1, wherein the signal processing module (3) includes an amplifier circuit (31) and a filter (32); the amplifier circuit (31) is electrically connected to the electric field sensing module (2) and the battery module (4) respectively to form a loop; the filter (32) is electrically connected to the amplifier circuit (31), and electrically connected to the battery module (4), the analog digital conversion module (5) and the radio transmission module (7) respectively to form a loop.

3. The object perspective detector defined in claim 2, wherein the battery module (4) has a battery pack (41), at least one USB charger (42) and a power switch unit (43); the battery pack (41) is electrically connected to the USB charger (42) and the power switch unit (43) respectively to form a loop; the power switch unit (43) is electrically connected to the electric field sensing module (2) and the signal processing module (3) respectively to form a loop;
the object perspective monitor-detector has an outer casing (1), the battery module (4) is located in the outer casing (1), and the USB charger (42) is located on one side of the outer casing (1).

4. The object perspective detector defined in claim 1, wherein the human-machine interface analysis module (6) includes an audio and video interactive device (61), a material status display (62) and a substance depth display (63); the audio and video interactive device (61), the material status display (62), and the substance depth display (63) are respectively electrically connected to the analog digital conversion module (5);

wherein the human-machine interface analysis module (6) is optionally connected to at least one of the audio and video interactive device (61), the material status display (62) and the substance depth display (63), and the substance depth display (63) are activated automatically when a person is approaching;

the radio transmission module (7) is applicable to long range telemetering or other controls.

\* \* \* \* \*